United States Patent
Inouchi et al.

(10) Patent No.: US 7,924,106 B2
(45) Date of Patent: Apr. 12, 2011

(54) OSCILLATION MODULE

(75) Inventors: Naoto Inouchi, Chitose (JP); Kazuo Akaike, Sayama (JP); Junichiro Yamakawa, Chitose (JP); Masazumi Kubota, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 150 days.

(21) Appl. No.: 12/318,256

(22) Filed: Dec. 23, 2008

(65) Prior Publication Data

US 2009/0174488 A1   Jul. 9, 2009

(30) Foreign Application Priority Data

Dec. 25, 2007   (JP) ................ P2007-331766

(51) Int. Cl.
*H03B 9/14*   (2006.01)
(52) U.S. Cl. .......................... 331/77; 331/158
(58) Field of Classification Search .......... 331/77, 331/158
See application file for complete search history.

(56) References Cited

U.S. PATENT DOCUMENTS

| | | |
|---|---|---|
| 2002/0109557 A1* | 8/2002 | Oita ................. 331/158 |
| 2007/0229195 A1* | 10/2007 | Shih ................ 333/204 |

FOREIGN PATENT DOCUMENTS

| | | |
|---|---|---|
| JP | U-50-001775 | 5/1973 |
| JP | U-57-074581 | 5/1982 |
| JP | 04245807 | 9/1992 |
| JP | 06-152453 | 5/1994 |
| JP | 06-152454 | 5/1994 |
| JP | 08065050 | 3/1996 |
| JP | 09-064689 | 3/1997 |
| JP | 2001267803 | 9/2001 |
| JP | 2003-218715 | 7/2003 |
| JP | 2007189471 | 7/2007 |

OTHER PUBLICATIONS

Japanese Utility Model Application No. S54-131445, filed Feb. 10, 1978, English translation of claims attached.
Japanese Utility Model Application No. S63-138735, filed Sep. 13, 1988, English translation of claims attached.
Office Action issued on Jan. 6, 2011 from Japan Patent Office in corresponding Japanese patent application No. 2007-331766 (English translation provided).

* cited by examiner

*Primary Examiner* — Joseph Chang
(74) *Attorney, Agent, or Firm* — Jacobson Holman PLLC

(57) ABSTRACT

To provide an oscillation module which is able to improve an input level by passing signals in a main signal band while removing near noise and far noise.
An oscillation module is provided with an OCXO, an amplifier, and a noise elimination filter. The noise elimination filter includes: a BPF passing a signal in the main signal band and eliminating far noise with respect to the main signal band; an L-BEF eliminating near noise in a low frequency band with respect to the main signal band; and an H-BEF eliminating near noise in a high frequency band with respect to the main signal band. Each filter is configured with a crystal filter.

8 Claims, 4 Drawing Sheets

OSCILLATION MODULE

BACKGROUND OF THE INVENTION

1. Field of the Invention

The present invention relates to an oscillation module using an oven controlled crystal oscillator (OCXO) or the like and, more particularly, to an oscillation module capable of reducing the noise of the oscillator.

2. Description of the Related Art

In wireless communication, high-rate data communication of several 100 Mbps to 1 Gbps is necessary to transmit a moving image or the like. For this reason, a synthesizer with excellent phase noise characteristics in a range of micro wave to millimeter wave bands is required.

As a signal source for this, an over-micro wave synthesizer is developing, and the final phase noise is equivalent to the double noise of the OCXO.

That is, in order to reduce the phase noise in the signal source such as the over-micro wave synthesizer, the reduction of phase noise in the OCXO is essential.

In a related art, for the purpose of reducing the noise, a filter is provided at a rear stage of the signal source, so as to reduce the noise.

Further, as a relating prior art, Japanese Patent Application Laid-Open No. 06-152453 (Patent Document 1), Japanese Patent Application Laid-Open No. 06-152454 (Patent Document 2), and Japanese Patent Application Laid-Open No. 2003-218712 (Patent Document 3) are disclosed.

Patent Documents 1 to 3 disclose filter circuits which are configured with a band elimination filter (BEF) and a band pass filter (BPF) with respect to input signals.

[Patent Document 1] Japanese Patent Application Laid-Open No. 06-152453

[Patent Document 2] Japanese Patent Application Laid-Open No. 06-152454

[Patent Document 3] Japanese Patent Application Laid-Open No. 2003-218712

Although a monolithic crystal filter (MCF) is appropriate for detuned noise elimination of several 10 kHz to several 100 kHz in order to realize noise elimination with the conventional filter, insertion loss increases and an input level is limited in the case of a narrow band. Therefore, degradation in carrier-to-noise ratio (CNR) at the output of the filter may occur.

SUMMARY OF THE INVENTION

The invention was made in consideration of the above-mentioned circumstances, and an object of the invention is to provide an oscillation module which is able to improve an input level by passing signals in a main signal band while removing near noise and far noise.

In addition, when the input signal has high power, the invention is to provide an oscillation module which is able to improve an input level by effectively passing signals in the main signal band and removing near noise and far noise.

In order to solve the problems in the above-mentioned problems encountered by the conventional example above, the invention provides an oscillation module comprising: a crystal oscillator oscillating a signal of a predetermined frequency; an amplifier amplifying the signal output from the crystal oscillator; and a noise elimination filter eliminating noise of the signal which is amplified by the amplifier, wherein the noise elimination filter includes a first crystal filter attenuating a signal in a low-frequency near band with respect to a main signal band of the signal, a second crystal filter attenuating a signal in a high-frequency near band with respect to the main signal band, and a third crystal filter attenuating a signal in a frequency far band lower than the low-frequency near band and in a frequency far band higher than the high-frequency near band while passing the signal in the main signal band.

According to the oscillation module of the invention, the first and second crystal filters may be band attenuation filters, the third crystal filter may be a band pass filter, and the first, second, and third crystal filters may have the same temperature characteristic. Therefore, it is possible to reduce deviation in filter characteristics.

According to the oscillation module of the invention, the noise elimination filter may be configured such that the first crystal filter, the second crystal filter, and the third crystal filter are connected in series in this order with respect to an input signal. Therefore, when the input signal has high power, it is possible to improve the input level by effectively passing the signal in the main signal band and removing the near noise and the far noise, and it is possible to prevent damage on the third crystal filter.

According to the oscillation module of the invention, a characteristic of the third crystal filter may be smooth compared to those of the first and the second crystal filters.

According to the oscillation module of the invention, the crystal oscillator may include an oven controlled crystal oscillator.

DESCRIPTION OF REFERENCE NUMERALS

1: oven controlled crystal oscillator (OCXO)
2: amplifier
10: noise elimination filter
11: low-frequency near noise band elimination filter (L-BEF)
12: band pass filter (BPF)
13: high-frequency near noise band elimination filter (H-BEF)

DESCRIPTION OF THE PREFERRED EMBODIMENTS

An embodiment of the invention will be described with reference to the drawings.

[Outline of Embodiment]

An oscillation module according to the embodiment of the invention is provided with an OCXO, an amplifier, and a noise elimination filter. The noise elimination filter includes: a BPF passing a signal in a main signal band and eliminating far noise (noise in a far band) with respect to the main signal band; a BEF (L-BEF) eliminating near noise (noise in a near band) in a low frequency band with respect to the main signal band; and a BEF (H-BEF) eliminating near noise in a high frequency band with respect to the main signal band. Each filter is configured with a crystal filter. Therefore, it is possible to improve the input level by passing the signal in the main signal band while eliminating the near noise and the far noise.

In the oscillation module according to the embodiment of the invention, the noise elimination filter is connected to the L-BEF, the H-BEF, and the BPF from an input side thereof in this order, or is connected to the H-BEF, the L-BEF, and the BPF from the input side thereof in this order. Therefore, when the input signal has high power, it is possible to prevent damage on the BPF by suppressing energy of the signal passing through the BPF with the BEF.

Figure 1:
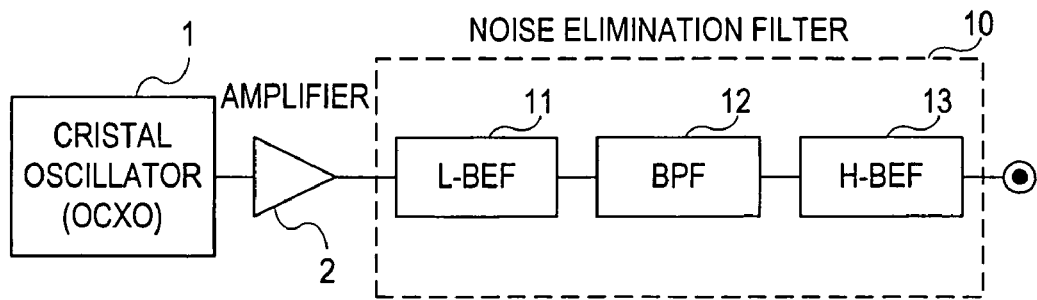
FIG. 1 is a block diagram illustrating a configuration of an oscillation module according to an embodiment of the invention.

[Configuration of Oscillation Module: FIG. 1]

The oscillation module (present module) according to the embodiment of the invention will be described with reference to FIG. 1. FIG. 1 shows a block diagram illustrating a configuration of the oscillation module according to the embodiment of the invention.

As shown in FIG. 1, the oscillation module according to the embodiment of the invention basically includes: an oven controlled crystal oscillator (OCXO) 1 oscillating a reference frequency signal; an amplifier 2 amplifying the oscillating frequency signal from the OCXO 1; and a noise elimination filter 10 eliminating noise with respect to a signal from the amplifier 2 and outputting the signal.

[Parts]

Parts of the module will be specifically described.

The oven controlled crystal oscillator (OCXO) 1 is an oscillator that is highly stabilized by inserting a crystal oscillation circuit into a temperature-controlled bath. Although the OCXO is used in this embodiment, it may be used with a voltage controlled crystal oscillator (VCXO), a temperature compensated crystal oscillator (TCXO) or the like.

The amplifier 2 amplifies the oscillating frequency signal input from the OCXO 1 and outputs the signal to the noise elimination filter 10.

[Noise Elimination Filter]

The noise elimination filter 10 includes: a low-frequency near noise band elimination filter (L-BEF) 11 eliminating low-frequency near noise (near noise in a low frequency band with respect to the main signal band); a band pass filter (BPF) 12 passing a signal in the main signal band and eliminating far noise (noise in a far band) with respect to the main signal band; and a high-frequency near noise band elimination filter (H-BEF) 13 eliminating high-frequency near noise (near noise in a high frequency band with respect to the main signal band).

In addition, the L-BEF 11, the BPF 12, and the H-BEF 13 have the same temperature characteristics in order to reduce deviation in characteristics.

Figure 2:
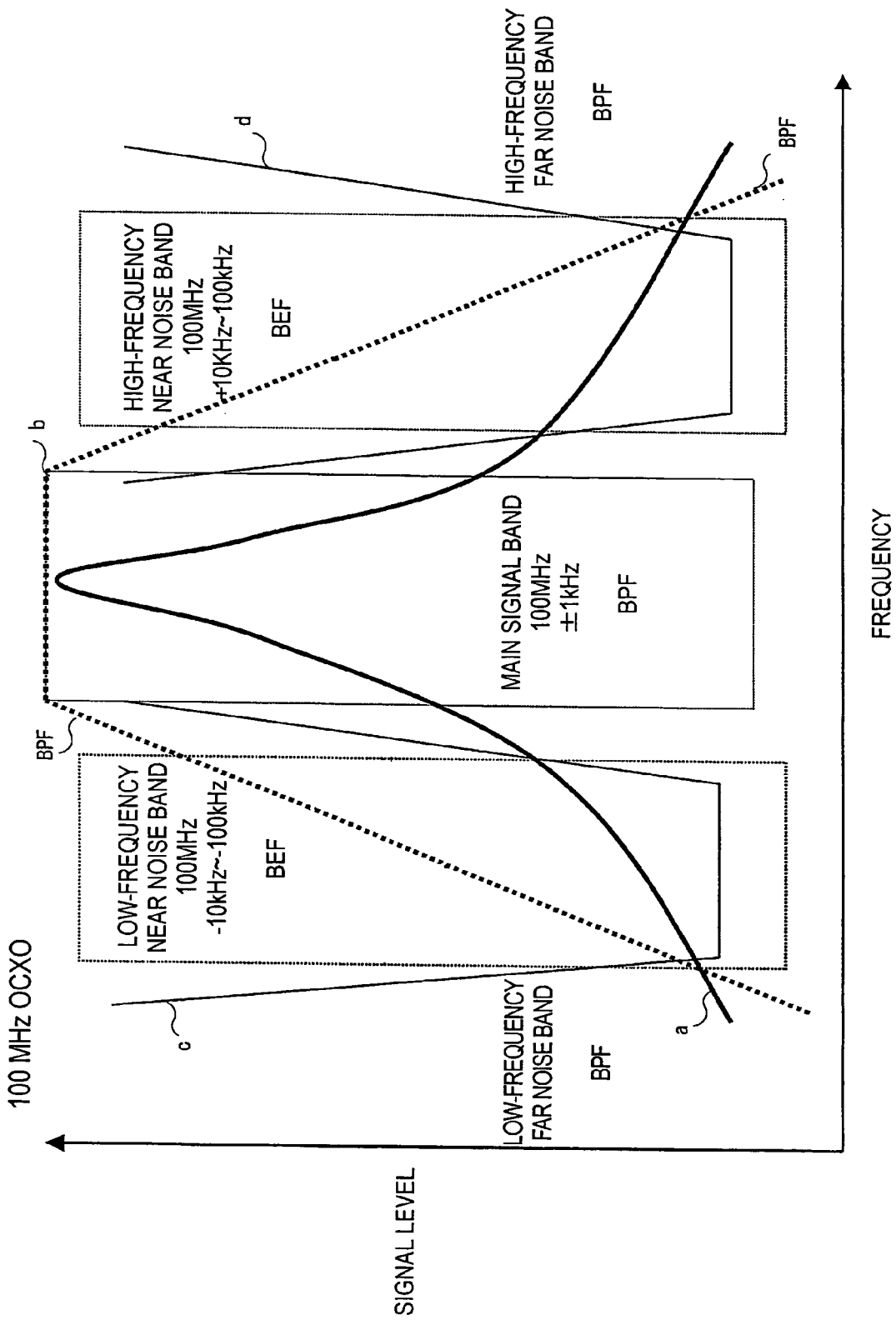
FIG. 2 is a diagram schematically illustrating outline of an oscillation spectrum and a filter characteristic.

[Outline of Oscillation Spectrum and Filter Characteristic: FIG. 2]

The characteristics of an oscillation spectrum and each filter characteristic in the noise elimination filter 10 of the oscillation module will be described with reference to FIG. 2. FIG. 2 shows a diagram schematically illustrating outline of the oscillation spectrum and the filter characteristic. In FIG. 2, the vertical axis represents signal levels and the horizontal axis represents frequencies.

In FIG. 2, the oscillation spectrum of the main signal is represented by line a, the filter characteristic of the BPF 12 is represented by line b, the filter characteristic of the L-BEF 11 is represented by line c, and the filter characteristic of the H-BEF 13 is represented by line d.

For example, the main signal band is 100 MHz±1 kHz, a low-frequency near noise band (near noise band of a low frequency with respect to the main signal bend) is 100 MHz–10 kHz to 100 MHz–100 kHz, a high-frequency near noise band (near noise band of a high frequency with respect to the main signal band) is 100 MHz+10 kHz to 100 MHz+100 kHz, a low-frequency far noise band (far noise band of a low frequency with respect to the main signal band) is a frequency band lower than the low-frequency near noise band, and a high-frequency far noise band (far noise band of a high frequency with respect to the main signal band) is a frequency band higher than the high-frequency near noise band.

As shown in FIG. 2, the signal in the main signal band is passed through the BPF 12, noise in the low-frequency near noise band is reduced by the L-BEF 11, noise in the high-frequency near noise band is reduced by the H-BEF 13, noise in the low-frequency far noise band is reduced by the BPF 12, and noise in the high-frequency far noise band is reduced by the BPF 12.

Figure 3:
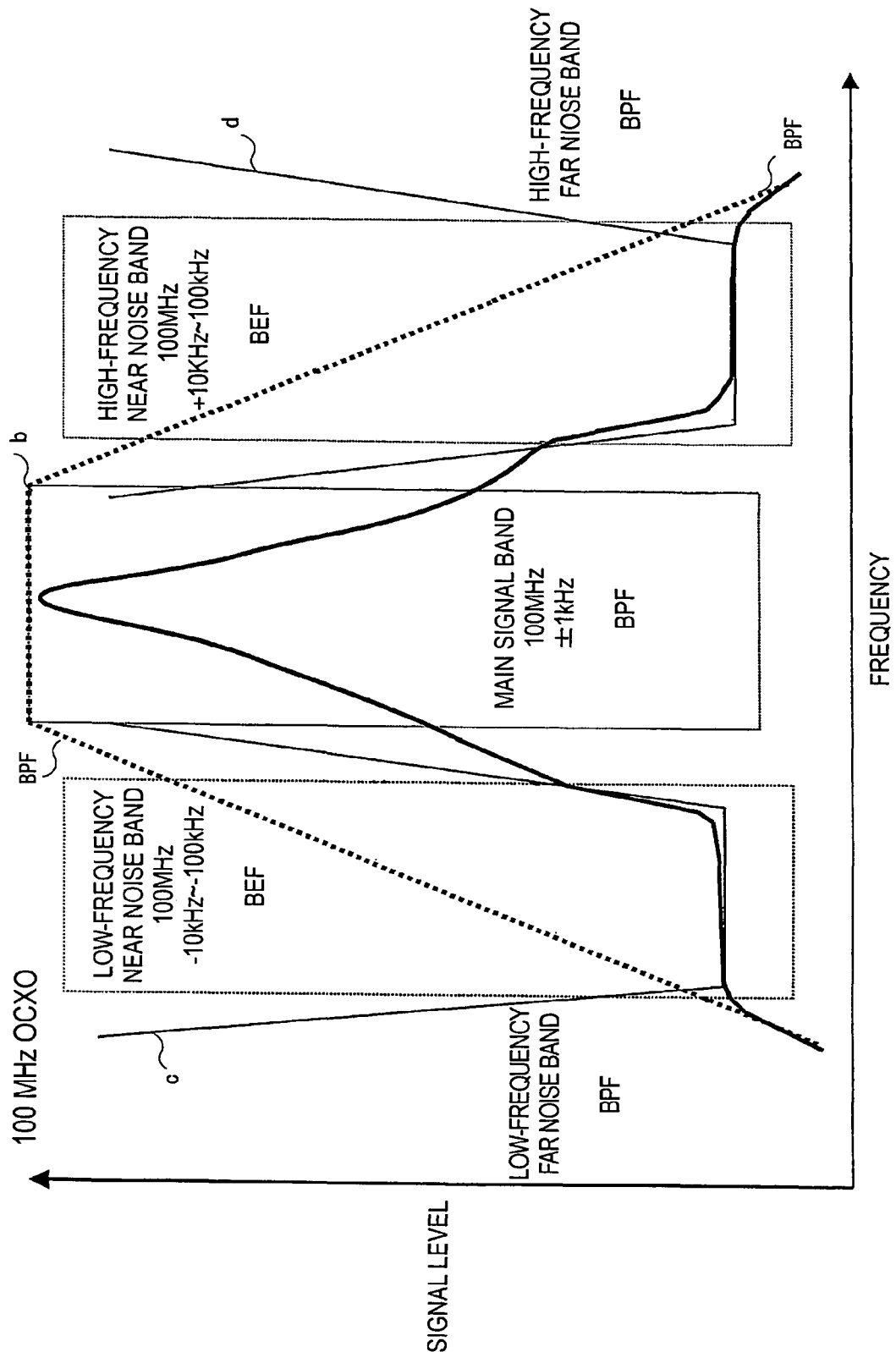
FIG. 3 is a diagram schematically illustrating outline of an oscillation spectrum after passing through a filter.

[Outline of Oscillation Spectrum after Passing through Filter: FIG. 3]

Next, the oscillation spectrum after passing through a filter will be described with reference to FIG. 3. FIG. 3 shows a diagram schematically illustrating outline of the oscillation spectrum after passing through a filter. In FIG. 3, the vertical axis represents signal levels and the horizontal axis represents frequencies.

As shown in FIG. 3, in the main signal band, a signal is passed through the BPF 12, the L-BEF 11, and the H-BEF 13. In the low-frequency near noise band, the high-frequency near noise band, the low-frequency far noise band, and the high-frequency far noise band other than the main signal band, noise is reduced.

Figure 4:
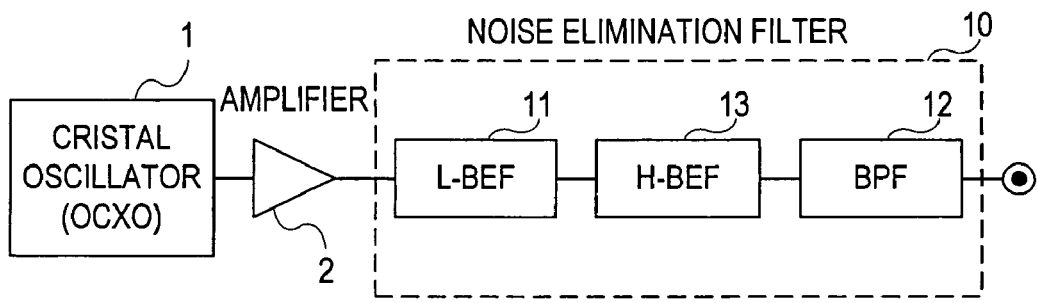
FIG. 4 is a block diagram illustrating a configuration of an oscillation module when an input signal has high power.

[Application: FIG. 4]

Next, optimal configuration of the oscillation module (oscillation module of the application) when the signal input to the noise elimination filter 10 has high power will be described with reference to FIG. 4. FIG. 4 shows a block diagram illustrating a configuration of the oscillation module when the input signal has high power.

As shown in FIG. 4, the oscillation module according to the application is different from the oscillation module shown in FIG. 1 in the order of the filters of the noise elimination filter 10.

Specifically, the L-BEF 11, the H-BEF 13, and the BPF 12 are placed in the order of closeness to the amplifier 2.

Here, it may be placed with the H-BEF 13, the L-BEF 11, and the BPF 12 in the order of closeness to the amplifier 2.

It is important that the BPF 12 is placed to the output terminal side.

With the configuration of the noise elimination filter 10 described above, when the input signal has high power, energy of the signal to be passed is suppressed by the L-BEF 11 and the H-BEF 13 at the front stage of the BPF 12. Therefore, since the energy of the signal input to the BPF 12 is reduced, there is no fear for damage on the BPF 12, so that a design and manufacture are easily made.

Figure 5:
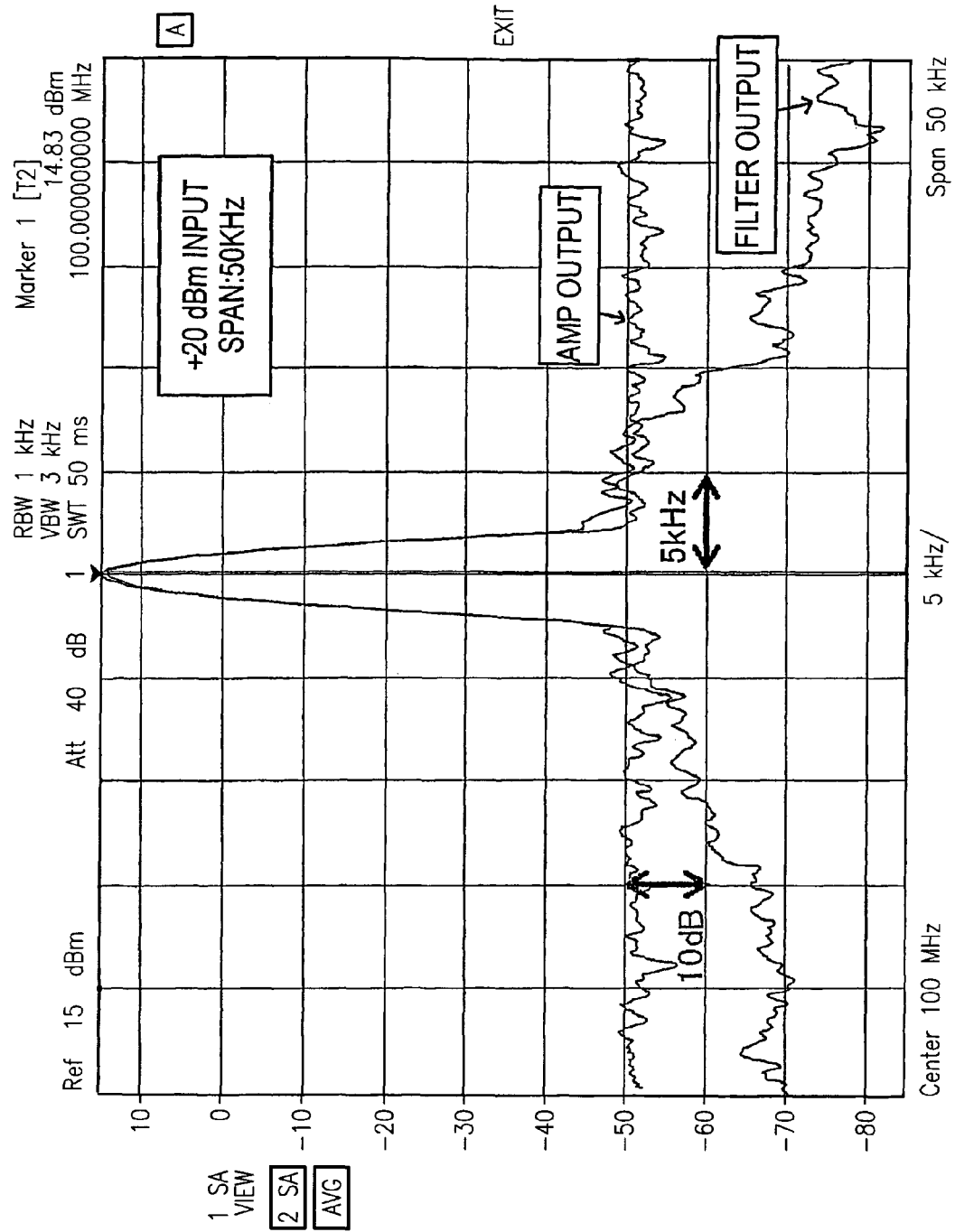
FIG. 5 is a diagram illustrating a filter characteristic of a noise elimination filter.

[Filter Characteristic: FIG. 5]

Next, the filter characteristic of the noise elimination filter 10 will be described with reference to FIG. 5. FIG. 5 shows a diagram illustrating the filter characteristic of the noise elimination filter. In FIG. 5, the vertical axis represents signal levels and the horizontal axis represents frequencies.

As shown in FIG. 5, a spectrum without being passed through the noise elimination filter 10 is shown as "AMP output" in FIG. 5 and a spectrum being passed through the noise elimination filter 10 is shown as "Filter output" in FIG. 5.

As shown in FIG. 5, when the signal is passed through the noise elimination filter 10, noise in bands other than the main signal band is reduced.

Figure 6:
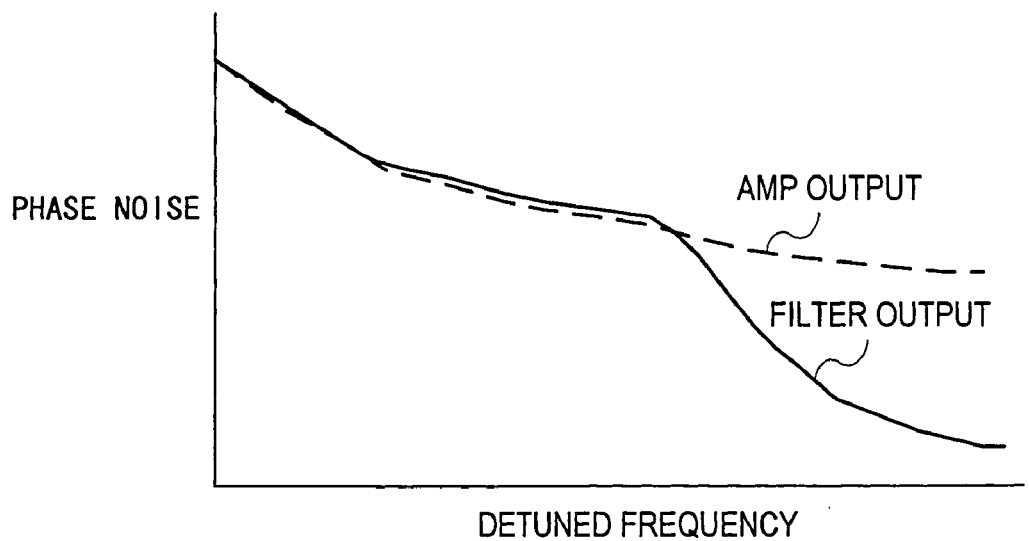
FIG. 6 is a diagram illustrating a phase noise characteristic of a noise elimination filter.

[Phase Noise Characteristic: FIG. 6]

Next, the phase noise characteristic of the noise elimination filter 10 will be described with reference to FIG. 6. FIG. 6 shows a diagram illustrating the phase noise characteristic of the noise elimination filter. In FIG. 6, the vertical axis represents phase noise and the horizontal axis represents detuned frequencies.

As shown in FIG. 6, the phase noise characteristic of the signal without being passed through the noise elimination filter 10 is shown as "AMP output" in FIG. 6 and the phase noise characteristic of the signal being passed through the noise elimination filter 10 is shown as "Filter output" in FIG. 6.

As shown in FIG. 6, when the signal is passed through the noise elimination filter 10, noise in bands detuned from the main signal band is reduced.

[Effect of Embodiment]

According to the oscillation module and the oscillation module of the application, the noise elimination filter 10 is configured such that the L-BEF 11, the BPF 12, and the H-BEF 13 are connected in series which are constituted with a crystal filter. The noise elimination filter 10 is placed in the rear stage of the amplifier 2 which amplifies the oscillating frequency signal of the oscillator 1. Therefore, it is possible to pass the signal only in the main signal band while suppressing noise in other bands, so that the input level is able to be improved.

The invention is preferable for the oscillation module which is able to improve the input level by passing signals in the main signal band while removing near noise and far noise.

What is claimed is:

1. An oscillation module comprising:
a crystal oscillator oscillating a signal of a predetermined frequency;
an amplifier amplifying the signal output from the crystal oscillator; and
a noise elimination filter eliminating noise of the signal which is amplified by the amplifier,
wherein the noise elimination filter includes
a first crystal filter attenuating a signal in a low-frequency near band with respect to a main signal band of the signal,
a second crystal filter attenuating a signal in a high-frequency near band with respect to the main signal band, and
a third crystal filter attenuating a signal in a frequency far band lower than the low-frequency near band and in a frequency far band higher than the high-frequency near band while passing the signal in the main signal band,
wherein the first and second crystal filters are band attenuation filters,
the third crystal filter is a band pass filter, and
the first, second, and third crystal filters have the same temperature characteristic.

2. The oscillation module according to claim 1, wherein the noise elimination filter is configured such that the first crystal filter, the second crystal filter, and the third crystal filter are connected in series in this order with respect to an input signal.

3. The oscillation module according to claim 1, wherein a characteristic of the third crystal filter is smooth compared to those of the first and the second crystal filters.

4. The oscillation module according to claim 2, wherein a characteristic of the third crystal filter is smooth compared to those of the first and the second crystal filters.

5. The oscillation module according to claim 1, wherein the crystal oscillator includes an oven controlled crystal oscillator.

6. The oscillation module according to claim 2, wherein the crystal oscillator includes an oven controlled crystal oscillator.

7. The oscillation module according to claim 1, wherein the main signal band where the signal is passed through the third crystal filter is 100 MHz±1 kHz;
a band where the signal is attenuated by the first crystal filter is 100 MHz−10 kHz to 100 MHz−100 kHz; and
a band where the signal is attenuated by the second crystal filter is 100 MHz+10 kHz to 100 MHz+100 kHz.

8. The oscillation module according to claim 2, wherein the main signal band where the signal is passed through the third crystal filter is 100 MHz±1 kHz;
a band where the signal is attenuated by the first crystal filter is 100 MHz−10 kHz to 100 MHz−100 kHz; and
a band where the signal is attenuated by the second crystal filter is 100 MHz+10 kHz to 100 MHz+100 kHz.

* * * * *